United States Patent [19]

Verma

[11] Patent Number: 4,912,062
[45] Date of Patent: Mar. 27, 1990

[54] METHOD OF ELIMINATING BIRD'S BEAKS WHEN FORMING FIELD OXIDE WITHOUT NITRIDE MASK

[75] Inventor: Jaipal S. Verma, Mesa, Ariz.

[73] Assignee: Motorola, Inc., Schaumburg, Ill.

[21] Appl. No.: 196,650

[22] Filed: May 20, 1988

[51] Int. Cl.⁴ .............................................. H01L 21/76
[52] U.S. Cl. .......................................... 437/69; 437/70; 437/239
[58] Field of Search .................... 437/63, 69, 28, 30, 437/70, 239, 240

[56] References Cited

U.S. PATENT DOCUMENTS

| | | | |
|---|---|---|---|
| 4,170,492 | 10/1979 | Bartlett et al. | 357/91 |
| 4,372,033 | 2/1983 | Chiao | 437/30 |
| 4,522,657 | 6/1985 | Rohatgi et al. | 357/91 |
| 4,570,325 | 2/1986 | Higuchi | 437/63 |
| 4,597,164 | 7/1986 | Havemann | 148/DIG. 82 |
| 4,717,687 | 1/1988 | Verma | 437/97 |

FOREIGN PATENT DOCUMENTS

| | | | |
|---|---|---|---|
| 58-170030 | 10/1983 | Japan | 437/940 |
| 59-4137 | 1/1984 | Japan | 437/70 |
| 59-100552 | 6/1984 | Japan | 437/61 |
| 0097637 | 5/1985 | Japan | 148/DIG. 117 |

*Primary Examiner*—Olik Chaudhuri
*Attorney, Agent, or Firm*—Joe E. Barbee

[57] ABSTRACT

A method of selectively forming a field oxide in a semiconductor device is provided by implanting a dopant into selected regions of a semiconductor substrate. A high concentration of dopant provides for an enhanced oxide growth rate. Another dopant may be implanted if necessary to provide a high field threshold voltage to prevent inversion. Annealing the semiconductor substrate and growing the oxide at a predetermined temperature will keep the high concentration of dopant in the semiconductor substrate, and thus maintain a state of enhanced oxide growth throughout the oxidation cycle. By taking advantage of enhanced oxidation, a mask, such as silicon nitride, is not required to prevent the substantial growth of oxide in the undoped region or active area.

12 Claims, 2 Drawing Sheets

METHOD OF ELIMINATING BIRD'S BEAKS WHEN FORMING FIELD OXIDE WITHOUT NITRIDE MASK

BACKGROUND OF THE INVENTION

This invention relates, in general, to the manufacture of semiconductor devices, and more particularly, to the formation of field oxide on selected regions of a semiconductor device.

Integrated circuits are comprised of a number of devices interconnected on a single chip. The active areas of the devices are often separated or isolated from one another by either a thick field oxide or a deep trench. A field oxide or a trench is provided in order to prevent the formation of inversion layers between the devices. If inversion takes place i the field region, conducting channels between devices are formed, thus causing device failure. One way to avoid such inversion is to increase the threshold voltage in the field region by increasing the field oxide thickness. In addition, a further increase in threshold voltage can be obtained by doping the field region with an impurity type of the same conductivity as the silicon substrate or epitaxial layer. The field threshold dopant is implanted into the field region before the field oxide is grown.

The difficulty in growing thick oxide layers are well known. Lengthy oxidations, high temperatures, and a hard masking layer (such as polysilicon or silicon nitride) are required. The field oxide is usually grown by first providing a thin layer of oxide over the silicon material, then a layer of silicon nitride is deposited and etched, leaving openings in the non-active areas of a circuit where the field oxide is desired. The growth rate of oxide on silicon nitride is much slower than on oxide or silicon, thus the silicon nitride acts as a mask. One of the disadvantages of using silicon nitride is that it may cause contamination of the surface of the semiconductor layer, which in turn may cause circuit failure.

The growth of the field oxide can take as long as fifteen hours, thus increasing the cycle time of the production process. Another problem that exists is that the oxide tends to grow underneath the edges of the silicon nitride mask. This oxide growth forms an unfavorable topography which resemble a "bird's beak". The resultant topography is undesirable because it encroaches into the active area of the device, thus reducing the length of the active area. The active area must be designed to account for the reduction in length, hence an integrated circuit designer is limited as to how small the semiconductor chip can be made. If the amount of encroachment could be reduced, the chip could be smaller in size, thus reducing the cost of manufacturing.

It is known that the presence of a dopant impurity in a semiconductor material, as well as the temperature, pressure, and ambient gases, affect the growth rate of the oxide. The presence of an impurity will enhance or retard the oxidation rate through two mechanisms. The concentration of the impurity and/or the damage caused to the lattice when the impurity is implanted may affect the growth rate of the oxide. Studies have found that boron, aluminum, phosphorus, arsenic, and antimony enhance the oxide growth rate, while germanium, silicon, and gallium retard the oxide growth rate.

A method disclosed in U.S. Pat. No. 4,170,492, issued to Bartlett et al on Oct. 9, 1979, takes advantage of unannealed implant damage to enhance oxidation in the field regions. A silicon nitride mask is still used to prevent oxide growth in the active areas. The enhanced growth of oxide in the damaged regions allows less time for the oxide to grow underneath the silicon nitride mask, thus reducing the amount of oxide encroaching into the active area of the circuit. However, if one were able to form the field oxide without the use of the silicon nitride mask, it would greatly reduce and simplify the number of processing steps, thus reducing the total cost of manufacturing.

By now it should be appreciated that it would be advantageous to provide a process for forming a field oxide region which not only reduces and simplifies the processing steps, but also reduces the amount of contamination, thus reducing the cost and improving the yield. In addition, a process which also allows for the reduction in area consumed by the inactive, field regions of the device is desirable.

Accordingly, it is an object of the present invention to provide an improved method for obtaining a field oxide.

Another object of the present invention is to provide a process for obtaining a field oxide without using silicon nitride, or other hard masks, thus reducing the amount of contamination.

A further object of the present invention is to provide a process for obtaining a field oxide with a reduced number of processing steps.

Yet another object of the present invention is to provide a process for obtaining a field oxide region which reduces the amount of encroachment int the active area, thus enabling a reduction in overall size of a semiconductor chip.

SUMMARY OF THE INVENTION

In accordance with the present invention, the advantages are provided by growing a field oxide at a faster rate on a heavily doped region of the semiconductor substrate. A high concentration of dopant will enhance the growth rate of oxide throughout the oxidation cycle. By using this technique, no mask is required to prevent a substantial growth of oxide in the undoped region or active area of a device. If additional field doing is needed to increase or compensate for the doping used for enhanced oxidation; another dopant impurity, implanted before the oxidation to a depth of approximately one-half the oxide to be grown, may be implanted to provide a high field threshold voltage to prevent inversion.

The preferred embodiments of the invention are illustrated in the accompanying drawings for purposes of exemplification, and are not to be construed as limiting in any manner.

DETAILED DESCRIPTION OF THE DRAWINGS

Figure 1:
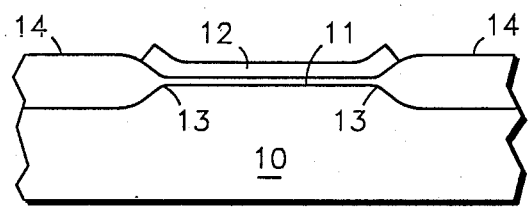
FIG. 1 illustrates a small portion of a semiconductor device made in accordance with the prior art.

FIG. 1 illustrates an example of a field oxide grown on a semiconductor substrate 10 with the use of a silicon nitride mask using a method in accordance with prior art. First a thin layer of thermal oxide 11 is grown to about 1000 angstroms on the silicon substrate 10. This oxide layer 11 is used to prevent stress-induced defects in the underlying silicon. A layer of silicon nitride is then deposited, patterned with a photoresist mask, and etched where field oxide 14 is to grow. The silicon nitride that is not removed forms mask layer 12, which prevents the oxidation of the underlying silicon. Region 13 shown in FIG. 1 is the "bird's beak" that is formed during oxidation. The oxide grows not only in the unmasked regions, but also horizontally underneath the edges of silicon nitride mask 12. This encroachment narrows the length of the active area which is between field oxide 14, and therefore, the active area must be made larger to account for this oxide growth. As a result, the total size and cost of the semiconductor chip increase.

Figure 2:
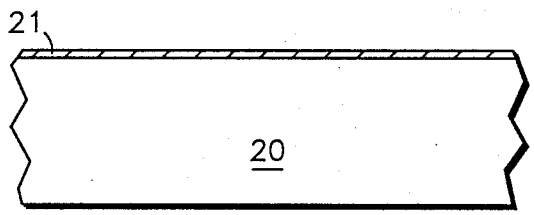
FIG. 2-6, 8 and 9 illustrate portions of a semiconductor device made with a preferred method of forming field oxide regions in accordance with the present invention.

Referring to FIGS. 2-9, a method of forming a field oxide of a semiconductor device according to the present invention is shown. By way of example, the manufacture of an N-channel integrated circuit using a P-type silicon substrate of (100) crystal will be illustrated. The resistivity of the substrate will depend on the electrical characteristics desired. It should be understood that a silicon substrate with an epitaxial layer may be used. Hereinafter, substrate will mean a silicon substrate or a silicon substrate having any epitaxial layer. FIG. 2 illustrates such a silicon substrate 20, with a thin layer of oxide 21 grown or deposited on the surface. Oxide layer 21 protects the surface of substrate 20 from contamination. A thickness of 200 angstroms is used in the preferred embodiment shown, however, an oxide thickness that allows the penetration of dopants to silicon substrate 20 is acceptable. The maximum oxide thickness that a dopant can penetrate is well known to those skilled in the art.

Figure 3:
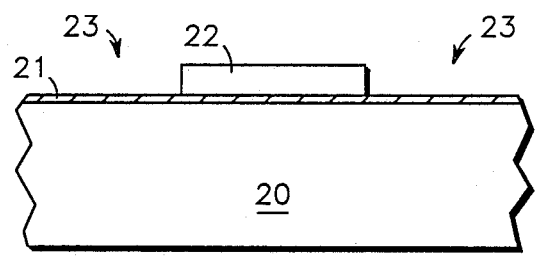

FIG. 3 illustrates the structure of FIG. 2 after subsequent processing steps. A layer of photoresist is applied over oxide layer 21, is exposed, developed, and etched to leave a photoresist layer 22, and an opening for a field region 23. Oxide layer 21 not only prevents the contamination of substrate 20, but provides for better adhesion to photoresist layer 21 than substrate 20 does.

Figure 4:
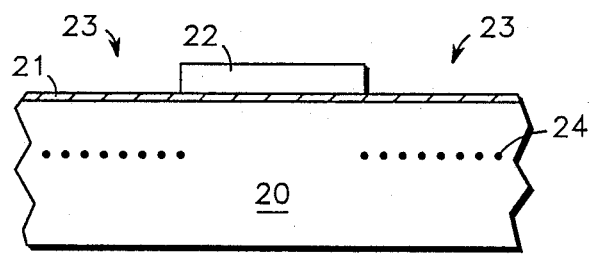

FIG. 4 illustrates the implantation of a dopant impurity 24, which is shown with the peak concentration well below the surface of substrate 20. Dopant 24 is preferably implanted to a depth of approximately one-half the thickness of a field oxide to be grown (illustrated as field oxide 28 in FIG. 8). A dopant of the same conductivity type as silicon substrate 20 is suitable; in this embodiment, boron with a dose of approximately $4 \times 10^{15}$ atoms/cm$^2$ is used. The addition of dopant 24 will provide for an increase of the threshold voltage in field region 23 if necessary. Thus, the addition of dopant 24 is optional if it is not necessary t increase the doping of substrate 20 in field region 23.

Figure 5:
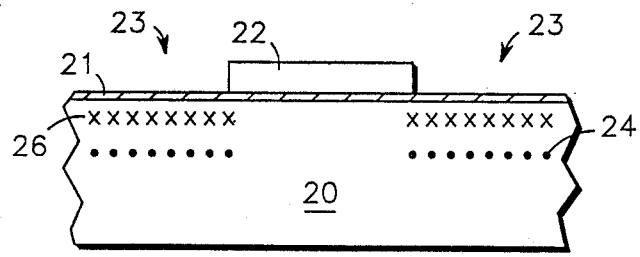

FIG. 5 illustrates the implantation of a second dopant impurity 26, which is shown with the peak concentration substantially near the surface of silicon substrate 20. Dopant 26 is of the type that enhances the growth rate of oxide, such as antimony, arsenic, phosphorus, boron, or the like. Arsenic is preferably used because it provides for the highest growth rate possible. The concentration of the dopant present is proportional to the growth rate of oxide. Therefore, it is desirable that dopant 26 exceed the thermal solid solubility limit in silicon, however, a dose much above this level does not seem to increase the growth rate of the oxide in field region 23 significantly. An arsenic dopant level of approximately $1 \times 10^{16}$ atoms/cm$^2$ is preferably used. The dopant level of other dopant impurities will vary according to the solid solubility limit of each in silicon.

Figure 6:
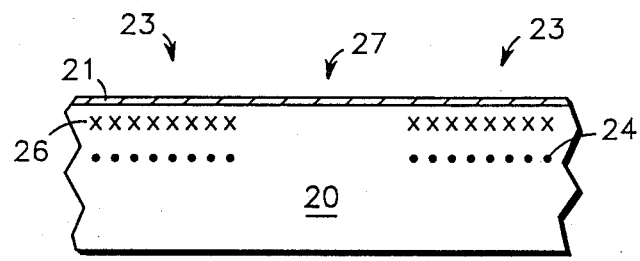

FIG. 6 illustrates the structure of FIG. 5 with photoresist layer 22 removed. Photoresist layer 22 protected an active area or undoped region 27 from receiving dopants 24 and 26.

Figure 7:
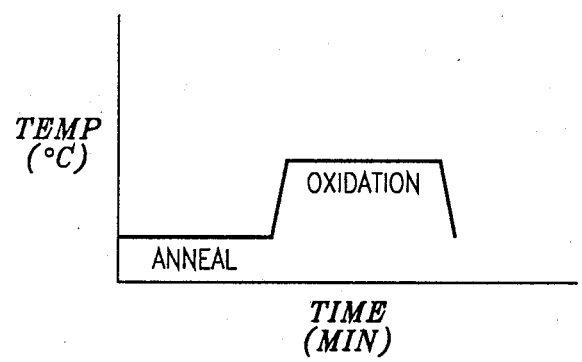
FIG. 7 illustrates the time and temperature profile of the cycle used in performing the present invention.

FIG. 7 illustrates, in graphical form, the temperature and time cycle that the structure of FIG. 6 is submitted to. The annealing is preferably done at a low temperature of approximately 600° C. for approximately two hours. The high concentration of dopant 26 added causes silicon substrate 20 to become amorphous in the region it was implanted. An anneal at a temperature of approximately 600° C. will recrystallize the amorphous silicon region back to single crystal silicon, however, damage to the silicon lattice may remain. Although an anneal is not necessary to provide for an enhanced oxide growth rate, it will ensure that a high concentration of dopant 26 remains in substrate 20 and not precipitate out of the silicon when subjected to higher temperatures. Next, the temperature is ramped to approximately 810° C. and steam is introduced to begin the oxidation. The oxidation time will vary depending on the oxide growth rate and the thickness o oxide desired. A typical thickness of field oxide 28 grow is approximately between 7,000 and 10,000 angstroms. The temperature range of 800° C. to 850° C. is believed to be the optimum range for differential oxide growth rate. This range is where the oxide growth rate is the fastest in doped field region 23 in comparison to the growth rate in active area or undoped region 27. Using an arsenic dose of $1 \times 10^{16}$ atoms/cm$^2$ results in a 7 to 1 differential growth rate. That is, the growth rate of oxide in doped region 23 is seven times faster than in undoped region 27. By using an appropriate doping level and temperature range, a state of enhanced oxidation can be maintained throughout the oxidation cycle. Enhanced oxidation i attainable within the temperature range of approximately 700° C. to 950° C. Outside of this range the oxidation is not maintained in a state of enhanced oxidation. Although the process is preferably carried out in a wet ambient and at atmospheric pressure, it may also be carried out in a dry ambient or under a reduced pressure; however, the growth rate of oxide may not be as fast. After the oxidation is complete, the temperature is ramped down to a level where the silicon substrates can be pulled out of the furnace without warpage.

Figure 8:
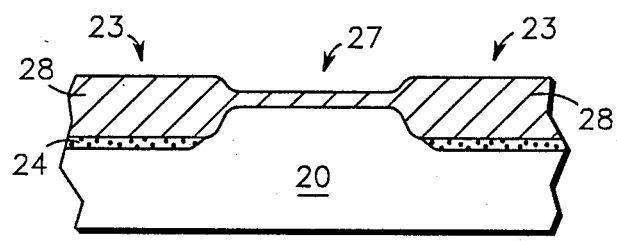

FIG. 8 illustrates the structure of FIG. 6 after it has been through the complete anneal and oxidation cycle shown in FIG. 7. The thickness of a field oxide layer 28 is approximately 7,000 to 10,000 angstroms. By taking advantage of the enhanced growth rate of oxide in heavily doped region 23, no mask is required to prevent a substantial growth of oxide in undoped region 27. Also, due to the enhanced growth in doped region 23, the encroachment of oxide into undoped region 27 is minimal. During the oxidation, growth of the oxide takes place not only on the surface of silicon substrate 20, but down into the silicon. Typically the amount of silicon substrate 20 consumed is one-half of the total field oxide 28 grown. Therefore, if the addition of dopant 24 is necessary, its peak concentration will be just below the new oxide/silicon interface when implanted at approximately one-half the total thickness of field oxide 28 grown. During the oxidation, dopant 26 is consumed by field oxide 28. In this embodiment, there is a residual amount of dopant 26 that is not consumed, which will be compensated by dopant 24. If a higher P+ doping is required to prevent inversion in field region 23, dopant 24 will provide for this. One case where a dopant 24 would not be needed is if the substrate 20 and dopant 26 are of the same conductivity type. Any residual dopant 26 would already provide for a higher doping of the same conductivity type as the substrate 20.

Figure 9:
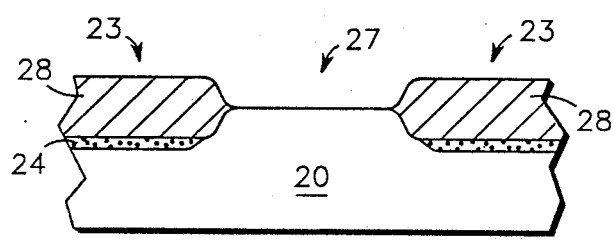

FIG. 9 illustrates the structure of FIG. 8 with a portion of field oxide 28 removed from the entire surface. Enough field oxide 28 is removed to etch down to silicon substrate 20 in undoped region 27 of the device. The structure is ready for the growth of a gate oxide (not shown). The removal of field oxide 28 from undoped region 27 is not necessary, however, typically a very clean and controlled thickness of gate oxide is desirable for the device.

By now it should be appreciated that there has been provided a new and improved method for forming field oxide regions by enhanced oxidation without the use of a silicon nitride mask.

What is claimed:

1. A method of forming a field oxide on a selected region of a semiconductor substrate of a first conductivity type without using a silicon nitride mask, comprising the steps of:
   adding a first dopant to a preselected region of the semiconductor substrate thereby providing at least one doped region and at least one undoped region, wherein the first dopant determines a threshold voltage in the doped region;
   adding a second dopant to the preselected region of the semiconductor substrate, the concentration of the second dopant exceeding a thermal solid solubility limit of the second dopant in the semiconductor substrate, wherein the second dopant is at a shallower depth in the semiconductor substrate than the first dopant; and
   forming an oxide layer at a pressure of about one atmosphere or less on the semiconductor substrate wherein the oxide forms in the doped region at a faster rate than in the updoped region due to enhanced oxidation caused by the second dopant to form the field oxide in a manner to minimize encroachment of field oxide into the undoped region.

2. The method of claim 1 wherein the first dopant is of the same conductivity type as the semiconductor substrate.

3. The method of claim 1 wherein the forming of the oxide layer is performed at a temperature less than 950° C.

4. A method for forming a field oxide on a selected region of a semiconductor substrate of a first conductivity type, comprising the steps of:
   providing a thin layer of oxide on the semiconductor substrate;
   adding a first dopant to a preselected region of the semiconductor substrate thereby providing at least one doped region and at least one undoped region, wherein the first dopant determines a threshold voltage in the doped region;
   adding a second dopant to the preselected region of the semiconductor substrate, the concentration of the second dopant exceeding a thermal solid solubility limit of the second dopant in the semiconductor substrate, wherein the second dopant is at a shallower depth in the semiconductor substrate than the first dopant;
   annealing the semiconductor substrate at a pressure of about one atmosphere or less and at approximately 600° C.; and
   forming an oxide layer on the semiconductor substrate at a temperature higher than 600° C., so that the oxide forms in the doped region at a faster rate than in the undoped region due to enhanced oxidation caused by the second dopant to form the field oxide in a manner to minimize encroachment of the field oxide into the undoped region.

5. The method of claim 4 wherein the first dopant is of the same conductivity type as the semiconductor substrate.

6. The method of claim 4 wherein the forming of the oxide layer is done at a temperature between 700° C. and 950° C.

7. A method of growing a field oxide on a selected region of a semiconductor substrate comprising the steps of:
   providing a thin layer of oxide on the semiconductor substrate;
   forming a masking layer on the oxide with at least one opening in the mask;
   implanting a first dopant through the opening to the semiconductor substrate thereby providing at least one doped region and at least one undoped region, wherein the first dopant determines a threshold voltage in the doped region;
   implanting a second dopant through the opening to the semiconductor substrate, the concentration of the second dopant exceeding a thermal solid solubility limit in the semiconductor substrate, wherein the second dopant is at a shallower depth in the semiconductor substrate than the first dopant;
   removing the masking layer;
   annealing the semiconductor substrate at a low temperature of approximately 600° C.; and
   growing an oxide layer on the semiconductor substrate by wet oxidation at a pressure of about one atmosphere or less and at a temperature higher than 600° C., so that the oxide forms in the doped region at a faster rate than in the undoped region due to enhanced oxidation caused by the second dopant to form the field oxide in a manner to minimize encroachment of the field oxide into the undoped region.

8. The method of claim 7 wherein the first dopant is boron implanted with a dose of approximately $4 \times 10^{15}$ atoms/cm$^2$ to a depth of approximately one-half of the desired oxide thickness to be grown in the doped region, and the second dopant is arsenic implanted with a dose of approximately $1 \times 10^{16}$ atoms/cm$^2$ to a depth substantially near the surface of the semiconductor substrate.

9. The method of claim 7 wherein the growing of the oxide layer is done at a temperature range of approximately 800° C. to 850° C., at a pressure of substantially one atmosphere.

10. The method of claim 7 wherein the thickness of the oxide grown in the doped region is approximately 7,000 to 10,000 angstroms.

11. The method of claim 7 including removing a predetermined thickness of oxide over both the doped and the undoped regions so that there is no oxide left in the undoped region of the semiconductor substrate.

12. A method of forming a field oxide layer on a selected region of a semiconductor substrate without using a silicon nitride mask, comprising the steps of:

adding a dopant of a type that enhances oxide growth rate to a field region of the semiconductor substrate thereby providing at least one doped region and at least one undoped region, wherein the dopant concentration in the doped region exceeds the thermal solid solubility of the dopant in the semiconductor substrate, at a pressure of about one atmosphere or less and;

forming an oxide layer on the semiconductor substrate wherein the oxide forms in the doped region at a faster rate than in the undoped region to form the field oxide in a manner to minimize encroachment of the field oxide into the undoped region.

* * * * *